United States Patent [19]

Brakus et al.

[11] Patent Number: 5,789,965
[45] Date of Patent: Aug. 4, 1998

[54] DRIVER CIRCUIT

[75] Inventors: Bogdan Brakus, Stockdorf; Heinz-Jürgen Roth, München, both of Germany

[73] Assignees: Siemens Aktiengesellschaft, Munich; SGS-Thomson Microelectronics GmbH, Grasbrunn, both of Germany

[21] Appl. No.: 817,984
[22] PCT Filed: Oct. 17, 1995
[86] PCT No.: PCT/DE95/01440
  § 371 Date: Apr. 25, 1997
  § 102(e) Date: Apr. 25, 1997
[87] PCT Pub. No.: WO96/13901
  PCT Pub. Date: May 9, 1996

[30] Foreign Application Priority Data

Oct. 28, 1994 [DE] Germany .................. 44 38 669.9

[51] Int. Cl.$^6$ ........................ H03K 19/013
[52] U.S. Cl. .................. 327/374; 327/108; 327/112; 327/437; 327/478
[58] Field of Search ............... 327/374, 108, 327/111, 112, 427, 478, 437

[56] References Cited

U.S. PATENT DOCUMENTS

| | | | |
|---|---|---|---|
| 4,251,742 | 2/1981 | Beelitz | 307/270 |
| 5,258,667 | 11/1993 | Ohtake et al. | 327/374 |
| 5,296,760 | 3/1994 | Oertle et al. | 307/475 |
| 5,349,243 | 9/1994 | McClure | 327/108 |
| 5,408,136 | 4/1995 | Ovens et al. | 327/374 |
| 5,576,654 | 11/1996 | Shu et al. | 327/374 |
| 5,587,676 | 12/1996 | Chowdhury | 327/108 |

FOREIGN PATENT DOCUMENTS

| | | |
|---|---|---|
| 0 620 646 | 10/1994 | European Pat. Off. . |
| 2 612 495 | 9/1977 | German Dem. Rep. . |
| 29 51 928 C2 | 7/1981 | German Dem. Rep. . |
| WO 93/01656 | 1/1993 | WIPO . |

OTHER PUBLICATIONS

301 Analog IC Designs, Ferranti Interdesign, Inc., 1987, p. 113.

Primary Examiner—Son T. Dinh
Attorney, Agent, or Firm—Hill, Steadman & Simpson

[57] ABSTRACT

Circuit arrangement of a driver using bipolar NMOS technology for generating fast high/low edges with a low bias current requirement.

5 Claims, 4 Drawing Sheets

1

DRIVER CIRCUIT

BACKGROUND OF THE INVENTION

The invention relates to a driver circuit for driving a switching unit. This driver circuit is particularly suitable for use in switched-mode power supplies and for driving transistors in switched-mode power converters. A driver circuit of this type is disclosed, for example, in 301 Analog IC Designs, Ferranti Interdesign, Inc., 1987, Page 113, Circuit Example 260. This circuit arrangement has the disadvantage that low-value input resistors cause a high current consumption. The known circuit arrangement furthermore has the disadvantage that the sink and source currents are too small for a relatively high switching frequency.

SUMMARY OF THE INVENTION

The invention is based on the object of specifying a driver circuit for high switching frequencies.

In general terms the present invention is a driver circuit having a first edge driver, which contains a first drive unit and a first switching-through unit, which has at least one first transistor. It is used for switching a first operating potential through to the output of the driver circuit. A second edge driver contains a second drive unit and a second switching-through unit, which has at least one second transistor. It is used for switching a second operating potential through to the output of the driver circuit. The emitter of the first transistor is connected to the collector of the second transistor and to an output of the driver circuit. The first drive unit is formed from an amplifier stage, which contains at least one first transistor, and from a downstream thyristor circuit. The second drive circuit is formed from a first and second emitter follower. The collector of the second emitter follower is connected to a collector of the first transistor of the first drive unit and, via a first diode, to the base of the first transistor. The collectors of the emitter followers are additionally connected via second and third diodes to the output of the driver circuit. The inputs of the first and second edge drivers are connected to one another via a resistor and are driven via one of the inputs.

Advantageous developments of the present invention are as follows. A partial circuit unit having a further transistor is provided. A capacitor, a diode and a resistor are connected to the base of the further transistor. The collector of the further transistor is connected to the base of the second transistor. The capacitor is connected to the collector of the second transistor. The emitter of the further transistor and the second terminal of the diode as well as the second terminal of the resistor are connected to the second operating potential.

The entire edge driver power of the second edge driver remains active during the active phase thereof.

A level converter stage is connected to the input of the second edge driver, the collector of the output transistor of the level converter stage having an open collector and being connected to the input of the second edge driver.

When an error message is present at the level converter stage, the second edge driver is activated and the first edge driver is deactivated.

In addition to the advantage that a fast high/low edge change is achieved, the invention affords the additional advantages that there is a small bias current requirement for operating the driver circuit and a charge stored at the output of the driver circuit is concomitantly used to drive the falling edge.

It is an advantageous development of the invention that the entire driver power remains active in the event of a potential corresponding to a low phase at the gate of the switching unit; this affords the advantage that, in the event of an inductive load, a current which decays over a relatively long period of time and is effective at the drain of the NMOS transistor via the parasitic drain-gate capacitance at the gate of the transistor, is discharged.

The provision of means for the charge reversal of parasitic capacitances at the nodes which are internal to the circuit and are connected to the circuit unit is an advantageous refinement of the invention. This affords the advantage that steeper rising and falling edges for driving the gate of the NMOS transistor are achieved.

The provision of means for reducing transit times is a further advantageous refinement. This affords the advantage that it is possible to realize high switching frequencies and constant duty ratios.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

In the figures.

DESCRIPTION OF THE PREFERRED EMBODIMENTS

Figure 1:
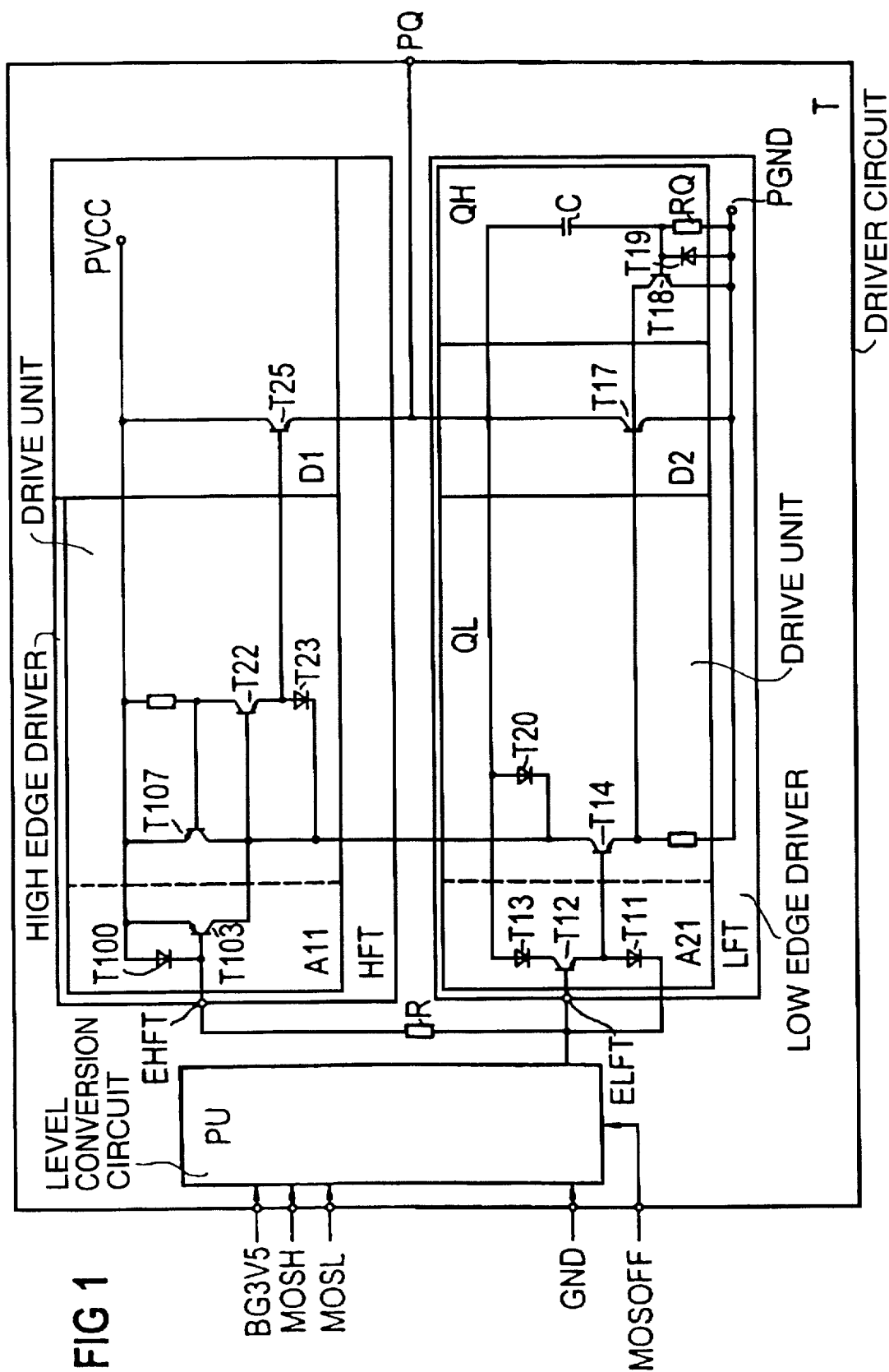
FIG. 1 shows a basic circuit diagram.

FIG. 1 diagrammatically shows a basic circuit diagram of the circuit arrangement of a driver T, to an extent necessary for an understanding of the invention. The basic circuit diagram of the driver circuit arrangement T is subdivided into a circuit unit PU, an ECL/NMOS level converter, a high edge driver HFT and a low edge driver LFT. The terminals listed below are essentially arranged on the driver T: BG3V5 and GND are the supply terminals of the drive circuit of the ECL/NMOS level converter. PVCC and PGND are the supply terminals of the driver circuit. MOSH and MOSL are the signal input terminals, and PQ is the output terminal for driving the gate of an NMOS transistor. With a potential corresponding to a low at MOSOFF, the terminal PQ can be switched low. MOSOFF is switched to the low state for the power down function and for interference functions that are provided. The entire driver power is present in the low state of PQ.

Figure 2:
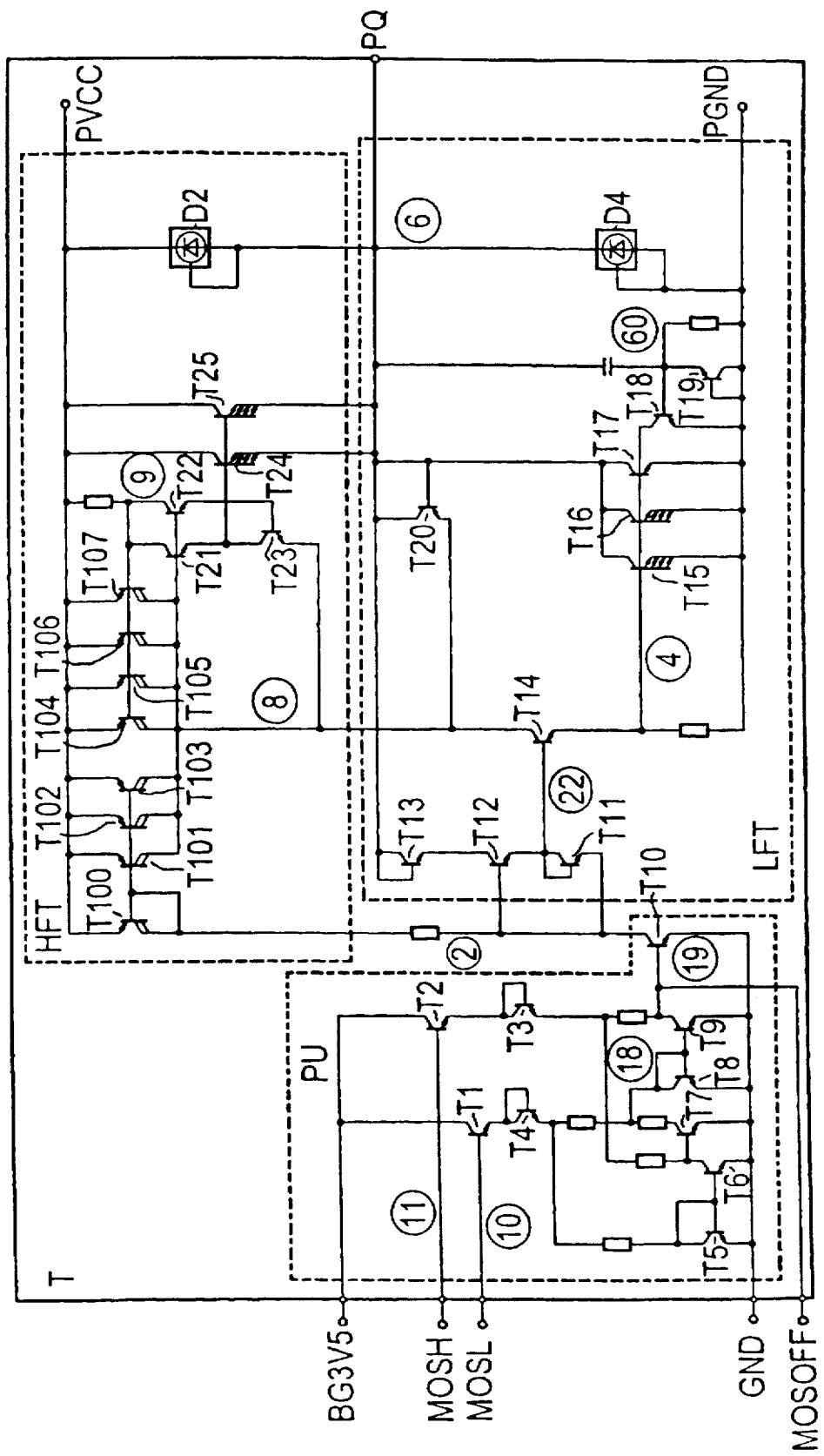
FIG. 2 shows a circuitry configuration.

FIG. 2 shows a circuitry configuration of the driver circuit T. This driver circuit T which can be produced using bipolar and NMOS technology and is used for generating fast high/low edges with a low bias current requirement is particularly suitable for use in switched-mode power supplies and in switched-mode converters.

Figure 3A:
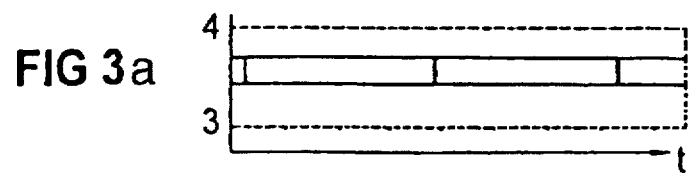
FIG. 3 a) shows an ECL input signal, b) shows an NMOS driver output signal and: c) shows parallel-path currents of the driver.
Figure 3B:
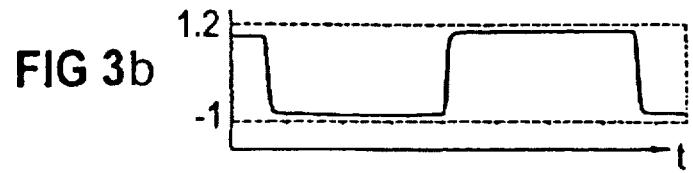

The functioning of the ECL/NMOS level conversion of the circuit PU, the signal train at the driver output, the high edge and the low edge at the terminal PQ are explained in detail below with reference to FIG. 2 and illustrated by the signal characteristics represented in FIGS. 3, 4 and 5.

ECL/NMOS level conversion in the circuit PU: In order to transmit fast signals with a small swing, a differential signal of just 320 mV is required at the circuit input MOSH-MOSL. ECL input signals for the nodes 10 and 11 of the exemplary embodiment of FIG. 2 are illustrated, for example, in FIG. 3a. T1 ... T10 are used for level conversion, the differential signal of 320 mV being converted in such a way that the current in the base of T10 can reliably pull the base of T12 to GND potential via the collector of T10. On the other hand, the current mirror T8, T9 is designed in such a way that T10 remains in the off state upon initiation of the high edge; the current through the collector-base capacitance of T10 is discharged to GND without being able to drive T10. This is achieved in the circuit by an asymmetrical mirror ratio of T9 to T8 in the ratio 3:1. In the on phase of T10, the current mirror transistor T8 is switched off via the transistors T5, T6 and the current mirror output T7, with the result that the total current offered by the level converter T1. ... T9 flows in the base of T10.

Driver output: The driver output is connected to the level converter circuit only via the collector of T10 and comprises a low edge driver and a high edge driver which mutually influence one another in such a way that the parallel-path current at the edges is kept at zero. The parallel-path current is considered to be the current which flows between PVCC and PGND in the transistors T24, T25, T15, T16 and T17 and does not flow into the terminal PQ or is not drawn therefrom, that is to say does not benefit the high or low edge and consequently generates an unutilized power loss. Since the gate of a power MOS transistor is situated at the terminal of PQ, the driver is dimensioned in such a way that it can drive the capacitive load present due to the gate as effectively as possible and continues to maintain the low or high state after the end of the edge, until a state change takes place from the inputs MOSH, MOSL, since current must also be driven outside the gate edge via parasitic capacitances at the gate to the drain particularly in the event of an inductive load.

Figure 3C:
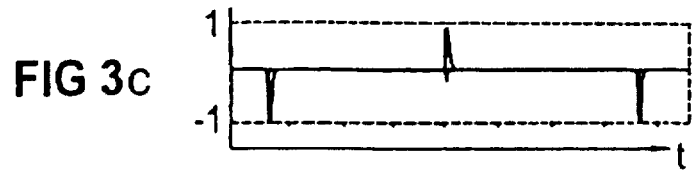
Figure 4A:
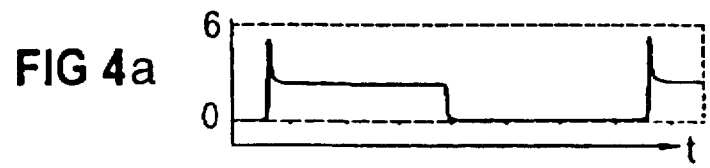
FIG. 4 shows voltage characteristics at the nodes 22, 4, 2.
Figure 4B:
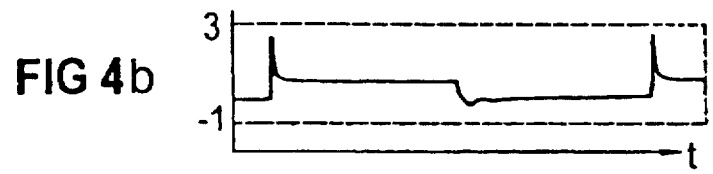

FIG. 3c illustrates the parallel-path currents at the driver output (node 6). With the circuit configuration indicated in FIG. 2, the parallel-path current at the negative edge of PQ is zero. At the positive edge of PQ, a parallel-path current is present only for a very short time. As an alternative, such a driver arrangement can be realized by two switches which alternately short-circuit PVCC and PGND with PG. In the phase where the switch between PVCC and PQ is closed, the gate is charged and the NMOS transistor goes into the on state. In the phase where the switch between PQ and PGND is closed, the gate is discharged and the NMOS transistor goes into the off state.

In the driver arrangement according to FIG. 2, these switches are embodied by the transistors T11 ... T20 for the low driver and T21 ... T25, T100 ... T107 for the high driver. The drivers HFT, LFT mutually influence one another such that the active driver in each case switches off the inactive driver and thus prevents parallel-path currents from flowing.

High edge at PQ: Assuming that current flows from the current mirror T8, T9 in the base of T10 and the collector of T10 pulls the 35K resistor and the base of T22 to GND, then T100 mirrors the current flowing through the resistor in the transistors T101 ... T103 and the triple Darlington arrangement of T12, T14, T15 ... T17 is deactivated. This means that the high edge at PQ is initiated, since the mirror current flows at the bases of T21, T22 and, via the Darlington follower T24, T25, charges the gate of the NMOS transistor at PQ and, furthermore, the bases of T104 ... T107 are driven via the collectors of T21, T22, which bases in turn send current into the bases of T21, T22. The loop triggers through; the switch for the high edge is active. A current-limiting effect is now realized mainly by the bulk resistances of the transistors and the inductive supply lines (bound wire).

In order to manage with as little current as possible from T101/T103, the node 8 is designed to have a low capacitance. For the layout of the circuit according to FIG. 2, this means that at the node 8 very short lines must be realized in the metal bearing having the least capacitance, in order to permit rapid starting of the transistors in the loop T21/T22 T104/T107, which then undertake the further charging of the node 8.

During the high edge, a current is brought to the bases of T15 ... T17 via the parasitic collector-base capacitances. This current would result in a parallel-path current, which is avoided by C1, T18, T19, since via C1, T18 (see FIG. 5c) is driven, which, via its collector, discharges the current at the bases of T15 ... T17 to PGND at the high edge of PQ (FIG. 5b). The currents at the bases of T12 and node 22 are discharged to GND via the diode T11 and T10, voltage characteristic in FIG. 4a, 4b. Consequently, a small parallel-path current (FIG. 3c) is produced only at the beginning of the high edge (until the base of T18 is driven via C1). If the gate at PQ is charged to PVCC-2 UBE, the current in the loop T21, T22, T104 ... T107 becomes zero. The driver is in the high state. There flows only the current in T100. ... .T103 and in the drive block, the level conversion.

Figure 7:
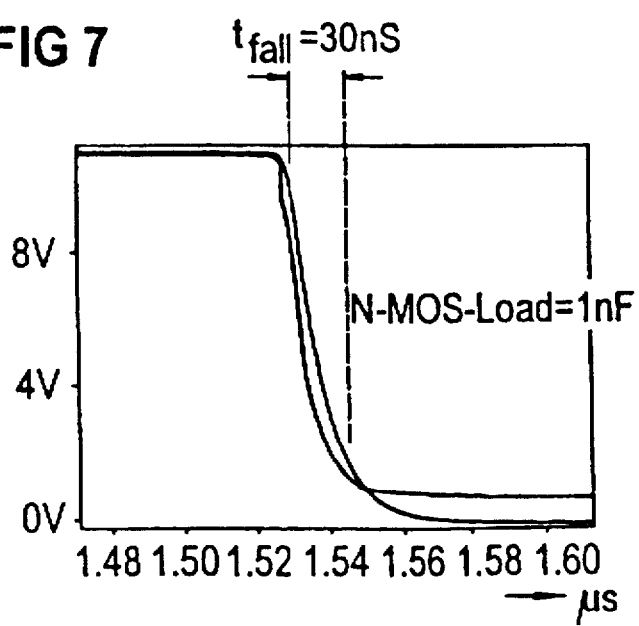
FIG. 7 shows voltage characteristics at the nodes 6, 8.

Low edge at PQ: If the base of T10 is switched off by the collector of T9 the current in the 35 K resistor flows into the base of T12, since the collector of T10 has acquired a high impedance. T12, T14, T15/T17 constitutes a triple Darlington arrangement which acts on PQ in the event of current into the base at T12. In order to avoid the parallel-path current at the low edge, the collector of T14 is connected to the high edge driver and ensures that the current from the collectors T101/T103 is discharged. Furthermore, the node at the emitter T21/T22 is depleted via the diode T23. If the collector T14 has reached a potential PQ-UBE T20, it participates with its collector current in the driving of the capacitive load at the node 6, PQ. T24/T25 are not able to produce parallel-path current components at their emitters, despite a fast fall time, since, owing to the diode T23, the bases are one UBE below the emitters at the edge (FIG. 7). The parasitic current feedback, produced at the node 8 which is internal to the circuit, to the node 9 is discharged by means of a 250 ohm resistor. At the end of the low edge, the low edge driver continues to remain active in order to discharge feedback from the drain of the external NMOS transistor to the gate to PGND.

In order to manage with as little current as possible from T101/T103, the node 8 must be designed with a low capacitance. For the layout of the circuit according to FIG. 1, this means that at the node 8 very short lines must be realized in order to permit rapid starting of the loop T21/T22, T104/ T107, which then undertakes the further charging of the node 8.

FIG. 3 represents ECL input signal level (3a), NMOS driver output signal (3b) and the parallel-path currents of the driver (3c).

Figure 4C:
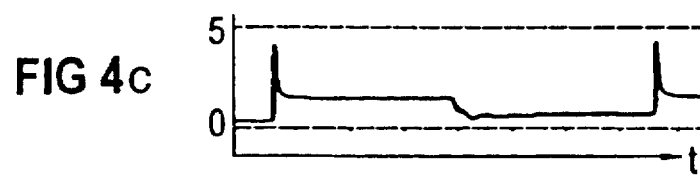

FIG. 4 illustrates the voltage characteristics with an overshoot at the positive edge at the node 22 in 4a, the voltage characteristic at the node 4 in 4b and the voltage characteristic at the node 2 in 4c.

Figure 5A:
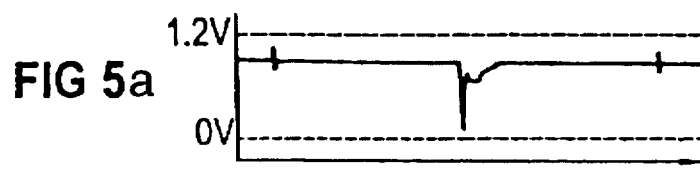
FIG. 5 shows voltage characteristics at the nodes 9, 4, 60.
Figure 5B:
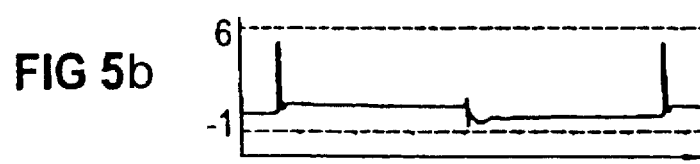
Figure 5C:
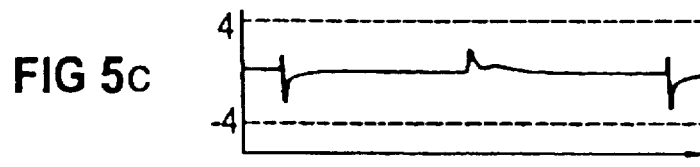

FIG. 5 illustrates the voltage characteristic at the node 9 in 5a and reproduces the voltage characteristic at the node 4 and 6 in 5b and 5c.

Figure 6:
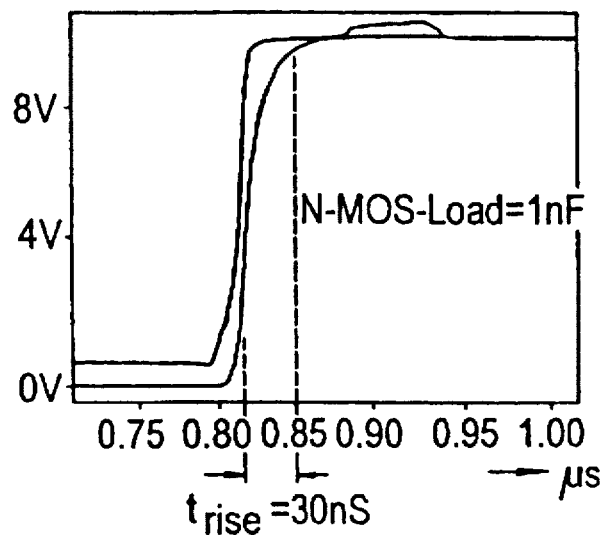
FIGS. 6 shows voltage characteristics at the nodes 6, 8.

FIG. 6 shows the voltage characteristics of the positive edge at the node 6 and 8.

FIG. 7 reproduces the voltage characteristics of the negative edge at the node 6 and 8.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A driver circuit, comprising:

a first edge driver having a first drive unit and a first switching-through unit, the first switching-through unit having at least one first transistor and being used for switching a first operating potential through to an output of the driver circuits;

a second edge driver having a second drive unit a second switching-through unit, the second switching-through unit having at least one second transistor and being used for switching a second operating potential through to the output of the driver circuit, an emitter of the first transistor being connected to a collector of the second transistor and to the output of the driver circuit;

the first drive unit having an amplifier stage, which contains at least one first transistor, and having a downstream thyristor circuit;

the second drive circuit unit having first and second emitter followers;

a collector of the second emitter follower connected to a collector of the first transistor of the first drive unit and, via a first diode, to a base of the first transistor of the first switching-through unit;

collectors of the first and second emitter followers additionally connected via second and third diodes, respectively, to the output of the driver circuit, and inputs of the first and second edge drivers connected to one another via a resistor and driven via one of the inputs of the first and second edge drivers.

2. The circuit arrangement as claimed in claim 1, wherein the circuit arrangement further comprises:

a partial circuit unit having a further transistor, a capacitor, a diode and a further resistor connected to a base of the further transistor, wherein a collector of the further transistor is connected to the base of the second transistor;

wherein the capacitor is connected to the collector of the second transistor; and wherein the emitter of the further transistor and a second terminal of the diode as well as a second terminal of the resistor are connected to the second operating potential.

3. The circuit arrangement as claimed in claim 1, wherein in the entire edge driver power of the second edge driver remains active during an active phase thereof.

4. The circuit arrangement as claimed in claim 1, wherein a level converter stage is connected to the input of the second edge driver, the collector of the output transistor of the level the level converter stage having an output transistor having a collector that is an open collector and that is connected to the input of the second edge driver.

5. The circuit arrangement as claimed in claim 1, wherein, when an error message is present at the level converter stage, the second edge driver is activated and the first edge driver is deactivated.

* * * * *